(12) United States Patent
Park et al.

(10) Patent No.: US 10,103,653 B2
(45) Date of Patent: Oct. 16, 2018

(54) PIEZOELECTRIC ENERGY HARVESTER AND MOBILE DEVICE HAVING THE SAME

(71) Applicant: SAMSUNG ELECTRONICS CO., LTD., Suwon-si (KR)

(72) Inventors: Hwi-yeol Park, Ansan-si (KR); Kyung-hoon Cho, Yongin-si (KR); Jin S. Heo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 870 days.

(21) Appl. No.: 14/463,037

(22) Filed: Aug. 19, 2014

(65) Prior Publication Data

US 2015/0288299 A1   Oct. 8, 2015

(30) Foreign Application Priority Data

Nov. 6, 2013  (KR) .................. 10-2013-0134357

(51) Int. Cl.
*H01L 41/113* (2006.01)
*H02N 2/18* (2006.01)

(52) U.S. Cl.
CPC ......... *H02N 2/186* (2013.01); *H01L 41/1136* (2013.01); *H02N 2/181* (2013.01)

(58) Field of Classification Search
CPC ..... H02N 2/18; H01L 41/113; H01L 41/1132; H01L 41/1134; H01L 41/1136; H01L 41/1138

USPC .................................................. 310/329, 339
See application file for complete search history.

(56) References Cited

U.S. PATENT DOCUMENTS

| 6,389,302 | B1 | 5/2002 | Vance | |
|---|---|---|---|---|
| 7,649,305 | B2 | 1/2010 | Priya et al. | |
| 2008/0136292 | A1* | 6/2008 | Thiesen | B60C 23/041 310/334 |
| 2009/0212665 | A1* | 8/2009 | Koser | B60C 23/0411 310/339 |
| 2009/0243433 | A1 | 10/2009 | Dirr et al. | |
| 2012/0068576 | A1* | 3/2012 | Lee | H01L 41/1136 310/339 |

FOREIGN PATENT DOCUMENTS

| JP | 2008-206236 A | 9/2008 |
|---|---|---|
| JP | 2012-175250 A | 9/2012 |
| KR | 10-2008-0098920 A | 11/2008 |
| KR | 10-0930458 B1 | 12/2009 |
| KR | 10-0951592 B1 | 4/2010 |
| KR | 10-1104229 B1 | 1/2012 |

* cited by examiner

*Primary Examiner* — Derek Rosenau
(74) *Attorney, Agent, or Firm* — Sughrue Mion, PLLC (57) ABSTRACT

A piezoelectric energy harvester includes a cover frame, a mass provided in the cover frame, and at least one piezoelectric transducer provided between an inner wall of the cover frame and the mass and configured to generate electrical energy by being deformed according to a relative movement between the cover frame and the mass.

19 Claims, 11 Drawing Sheets

PIEZOELECTRIC ENERGY HARVESTER AND MOBILE DEVICE HAVING THE SAME

RELATED APPLICATIONS

This application claims the benefit of Korean Patent Application No. 10-2013-0134357, filed on Nov. 6, 2013, in the Korean Intellectual Property Office, the disclosure of which is incorporated herein in its entirety by reference.

BACKGROUND

1. Field

The present disclosure relates to methods and apparatuses for a piezoelectric energy harvester, and more particularly, to a piezoelectric energy harvester for generating electric energy by using a mass, and a mobile device having the piezoelectric energy harvester.

2. Description of the Related Art

Piezoelectric energy harvesting technology is eco-friendly energy technology that converts mechanical energy, such as vibrations, shocks, sound, etc., which are generated everywhere, into electrical energy by using a piezoelectric material, and the converted electrical energy is stored. A typical piezoelectric energy harvester may be a cantilever type piezoelectric energy harvester, in which a piezoelectric device is deformed as an elastic member vibrates and thus electrical energy is generated. In the cantilever type piezoelectric energy harvester, a resonance mode or a mass may be used to obtain a high power. In addition to the above, there have been many other researches about piezoelectric energy harvesters that may harvest a large amount of electrical energy from a relatively small amount of mechanical energy. On the other hand, since the piezoelectric energy harvester may not be used as a power source when external mechanical energy is not continuously received, a storage device such as a battery or capacitor to store converted electrical energy, is needed.

SUMMARY

Provided are methods and apparatuses for a piezoelectric energy harvester that generates electrical energy by using a mass and a mobile device having the piezoelectric energy harvester.

Additional aspects will be set forth in part in the description which follows and, in part, will be apparent from the description, or may be learned by practice of the presented exemplary embodiments.

According to an exemplary embodiment, a piezoelectric energy harvester includes a cover frame, a mass provided in the cover frame, and at least one piezoelectric transducer provided between an inner wall of the cover frame and the mass and configured to generate electrical energy by being deformed according to a relative movement between the cover frame and the mass.

The at least one piezoelectric transducer may have a beam shape.

The at least one piezoelectric transducer may include one end fixed on the inner wall of the cover frame and the other end that is not fixed.

When there is no relative movement between the cover frame and the mass, the second end of the at least one piezoelectric transducer may be provided in contact with the mass or separated from the mass.

The second end of the at least one piezoelectric transducer may be in a state of not being deformed or in a state of being deformed by contacting the mass.

The mass may include at least one an energy storage device and a mobile device.

A circuit configured to perform at least one from among rectifying and storing the electrical energy generated by the at least one piezoelectric transducer may be provided on the cover frame.

The piezoelectric energy harvester may further include at least one antifriction guide that protrudes from at least one of an upper wall and a lower wall of the cover frame and reduces friction between the cover frame and the mass.

The at least one piezoelectric transducer may include a substrate and an array of a first electrode, a piezoelectric layer, and a second electrode which are sequentially stacked on the substrate.

The at least one piezoelectric transducer may further include an insulation layer configured to cover the substrate and the second electrode.

The substrate may include an elastic material.

The at least one piezoelectric transducer may include a substrate, an array of a first electrode, a first piezoelectric layer, and a second electrode which are stacked on a first surface of the substrate, and an array of a third electrode, a second piezoelectric layer, and a fourth electrode which are stacked on a second surface of the substrate.

The at least one piezoelectric transducer may further include an insulation layer configured to cover the second electrode and the fourth electrode.

An amount of the electrical energy generated when the at least one piezoelectric transducer is deformed may be controlled according to at least one from among a number of the at least one piezoelectric transducer, a size and a thickness of each of the at least one piezoelectric transducer, an interval between the at least one piezoelectric transducer, and an interval between the inner wall of the cover frame and the mass.

According to another exemplary embodiment, a mobile device includes a cover frame, a mobile device main body provided outside the cover frame, a mass provided inside the cover frame, and at least one piezoelectric transducer provided between an inner wall of the cover frame and the mass and configured to generate electrical energy by being deformed according to a relative movement between the cover frame and the mass, in which the piezoelectric transducer includes one end fixed on the inner wall of the cover frame and the other end that is not fixed.

The mass may include an energy storage device.

A circuit configured to perform at least one from among rectifying and storing the electrical energy generated by the at least one piezoelectric transducer may be provided on the cover frame.

The mobile device may further include at least one antifriction guide that protrudes from at least one of an upper wall and a lower wall of the cover frame and reduces friction between the cover frame and the mass.

The at least one piezoelectric transducer may have a beam shape.

The at least one piezoelectric transducer may include a first end fixed on the inner wall of the cover frame and a second end that is not fixed.

When there is no relative movement between the cover frame and the mass, the second end of the at least one piezoelectric transducer may be provided in contact with the mass or separated from the mass.

The second end of the at least one piezoelectric transducer may be provided in a state of not being deformed or in a state of being deformed by contacting the mass.

According to another exemplary embodiment, a device for generating piezoelectric energy includes a cover frame, a mass disposed on an interior of the cover frame, and at least one piezoelectric transducer provided on an interior wall of the cover frame and configured to generate electrical energy, where the piezoelectric transducer is provided between the mass and the interior wall of the cover frame.

The device may further include a battery configured to store the electrical energy.

The mass may deform the at least one piezoelectric transducer when the mass is moved.

The mass may be moved by a mechanical force.

The cover frame may include at least one antifriction guide on the interior of the cover frame.

The at least one antifriction guide may reduce a friction between the mass and the cover frame.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Reference will now be made in detail to exemplary embodiments, examples of which are illustrated in the accompanying drawings, wherein like reference numerals refer to like elements throughout. Also, the thickness or size of each layer illustrated in the drawings is exaggerated for convenience of explanation and clarity. In the following description, when a layer is described to exist on another layer, the layer may exist directly on the other layer or a third layer may be interposed therebetween. Since a material forming each layer in the following embodiment is exemplary, other materials may be used therefore. In this regard, the exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Figure 1:
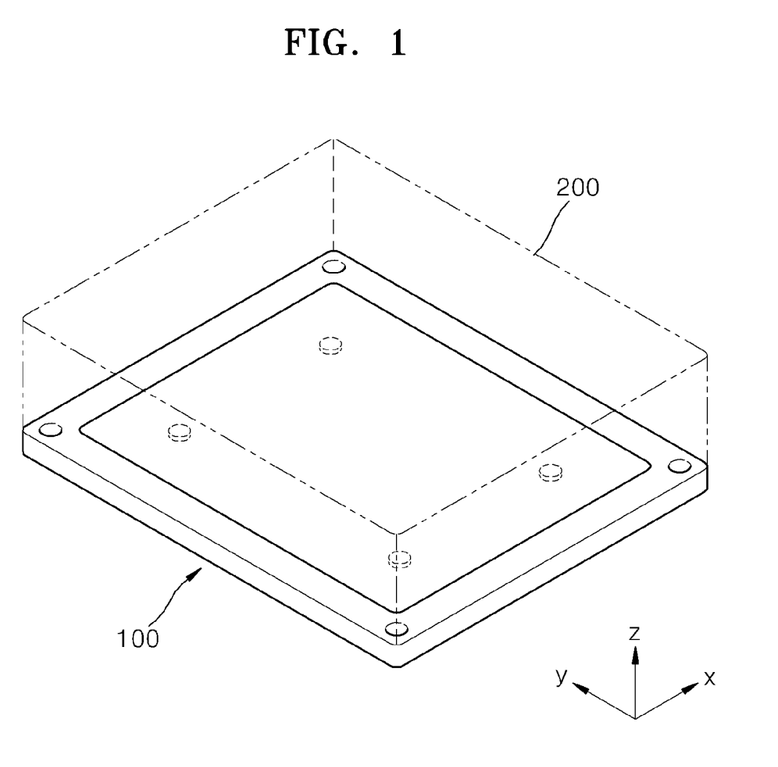
FIG. 1 is a perspective view of a piezoelectric energy harvester according to an exemplary embodiment.
Figure 2:
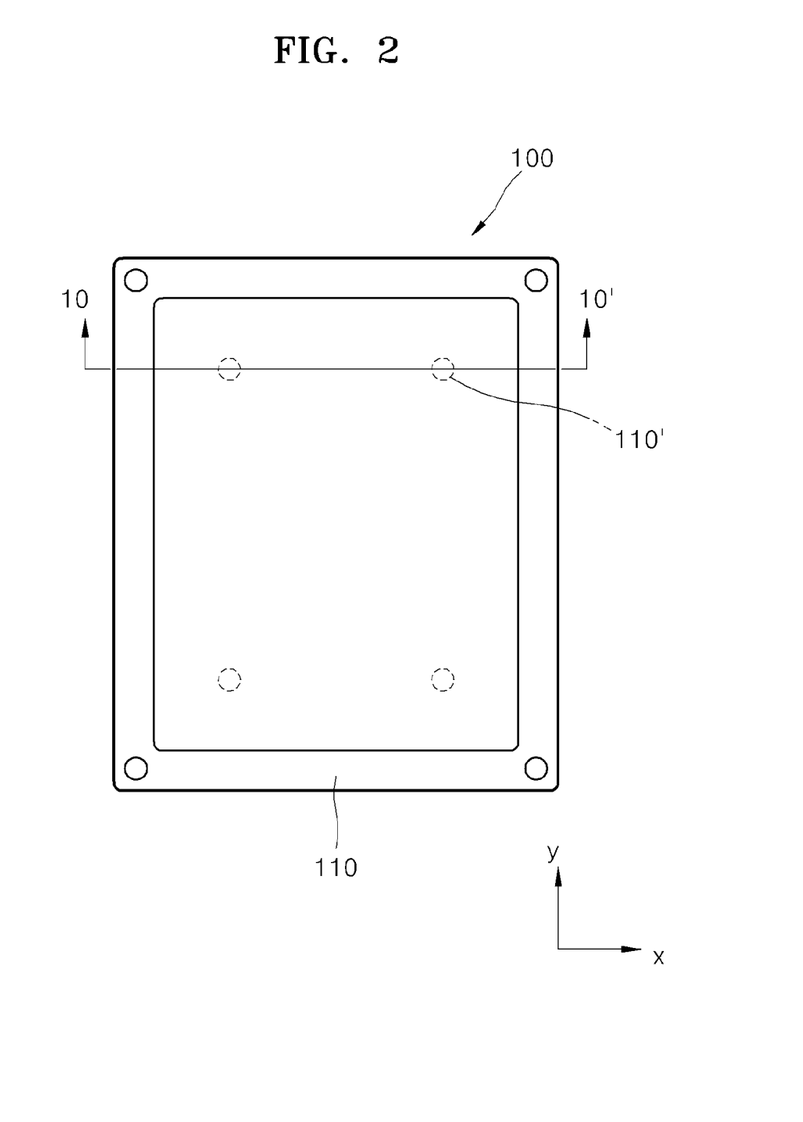
FIG. 2 is a plan view of the piezoelectric energy harvester of FIG. 1.
Figure 3:
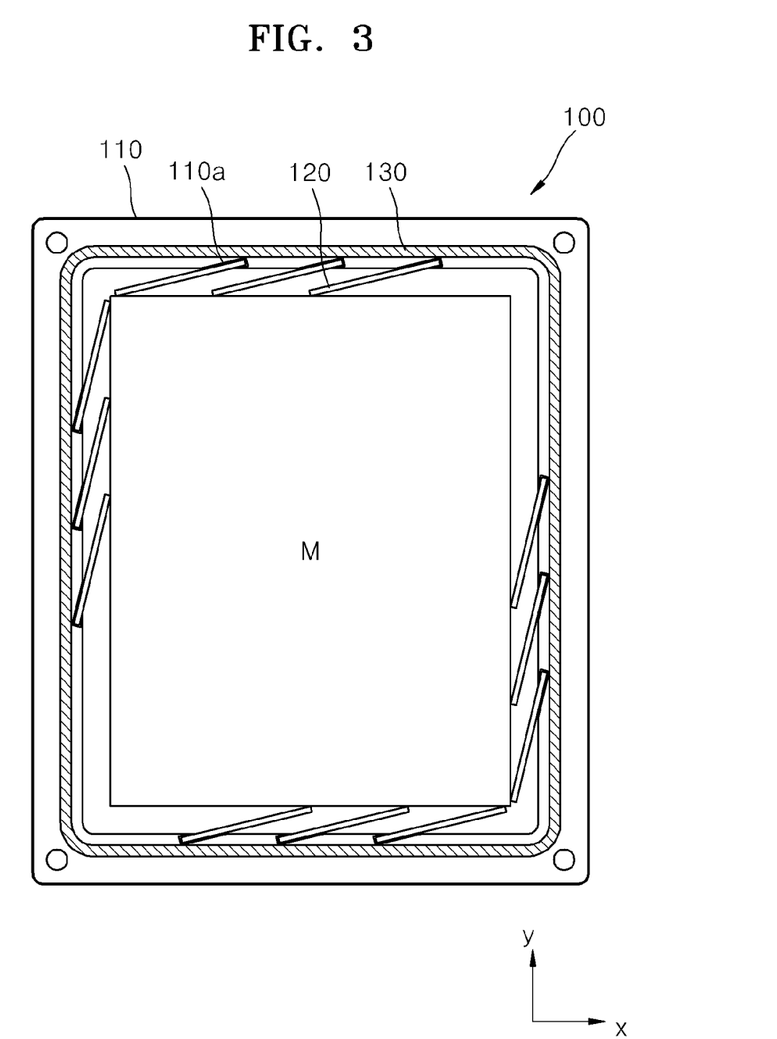
FIG. 3 is a plan view illustrating an interior of the piezoelectric energy harvester of FIG. 1.
Figure 4:
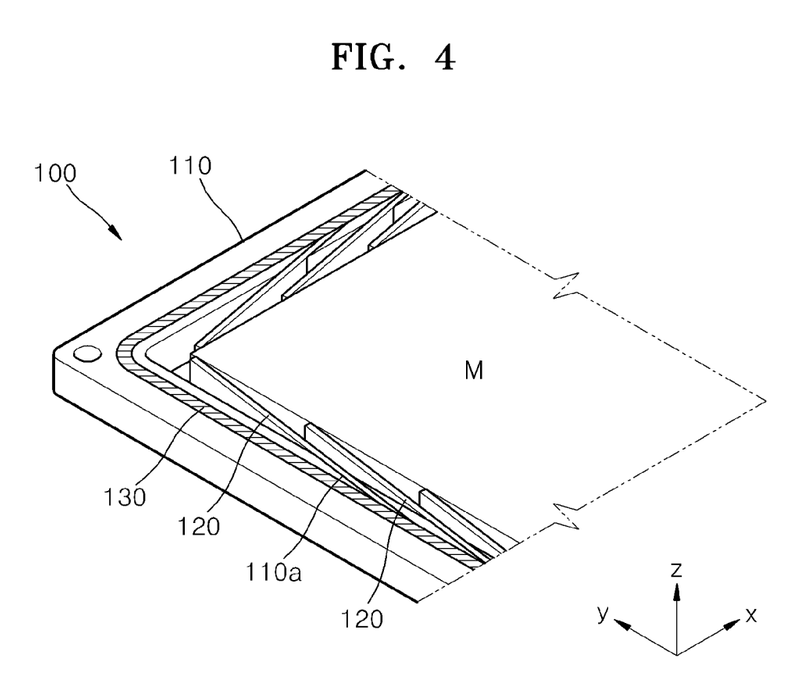
FIG. 4 is a partial perspective view of the interior the piezoelectric energy harvester of FIG. 3.

FIG. 1 is a perspective view of a piezoelectric energy harvester 100 according to an embodiment. FIG. 2 is a plan view of the piezoelectric energy harvester 100 of FIG. 1. FIG. 3 is a plan view illustrating an interior of the piezoelectric energy harvester 100 of FIG. 1. FIG. 4 is a partial perspective view of the interior the piezoelectric energy harvester 100 of FIG. 3.

Referring to FIGS. 1 to 4, the piezoelectric energy harvester 100 includes a cover frame 110, a mass M provided in the cover frame 110, and a plurality of piezoelectric transducers 120 provided between the mass M and the cover frame 110. As a mobile device main body 200 is provided outside the cover frame 110, for example, on an upper portion of the cover frame 110, the piezoelectric energy harvester 100 and the mobile device main body 200 may constitute a mobile device.

The cover frame 110 has a space to accommodate the mass M therein. The space provided in the cover frame 110 may have a volume larger than the volume of the mass M so that the mass M may move therein. The mass M that moves in the cover frame 110 as described below deforms the piezoelectric transducers 120, thereby generating electrical energy. An energy storage device such as a battery may be used as the mass M. FIGS. 1 to 4 illustrate an exemplary embodiment of a case where the cover frame 110 and the mass M have a rectangular shape. However, exemplary embodiments are not limited thereto, and the cover frame 110 and the mass M may have a variety of shapes, such as a circle or a polygon.

Figure 12A:
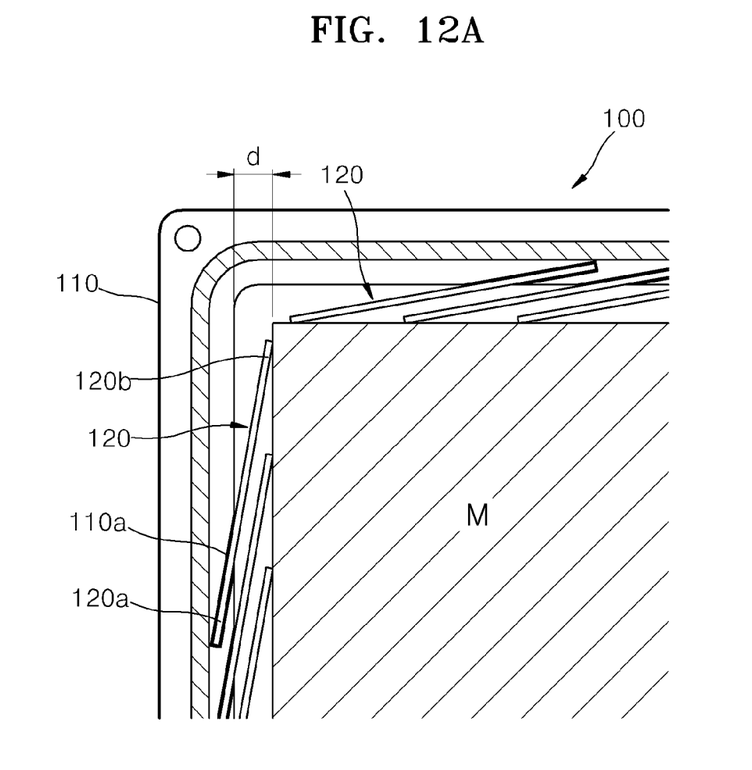
FIGS. 12A and 12B illustrate an operation of the piezoelectric energy harvester of FIGS. 1 to 4.

The mass M may be provided such that the mass M is separated a distance d, as shown in FIG. 12A, from an inner wall of the cover frame 110. For example, the interval between the inner wall of the cover frame 110 and the mass M may be about 0.5 mm-about 8 mm, and preferably about 2 mm, but the exemplary embodiments are not limited thereto. In other words, the interval between the inner wall of the cover frame 110 and the mass M may vary in a variety of ways according to the size of the piezoelectric energy harvester 100, the number and size of the piezoelectric transducers 120, etc. The piezoelectric transducers 120 are provided between the inner wall of the cover frame 110 and the mass M. The piezoelectric transducers 120 may generate electrical energy as they are deformed by relative movements between the cover frame 110 and the mass M. Each of the piezoelectric transducers 120 has a cantilever structure in which one end thereof is fixed on the inner wall of the cover frame 110 and the other end thereof is not fixed. To this end, a plurality of insertion holes 110a, in each of which the one end of each of the piezoelectric transducers 120 is inserted, are formed in the inner walls of the cover frame 110. As the one ends of the piezoelectric transducers 120 are inserted in the insertion holes 110a, the piezoelectric transducers 120 may be fixed to the cover frame 110.

Figure 13:
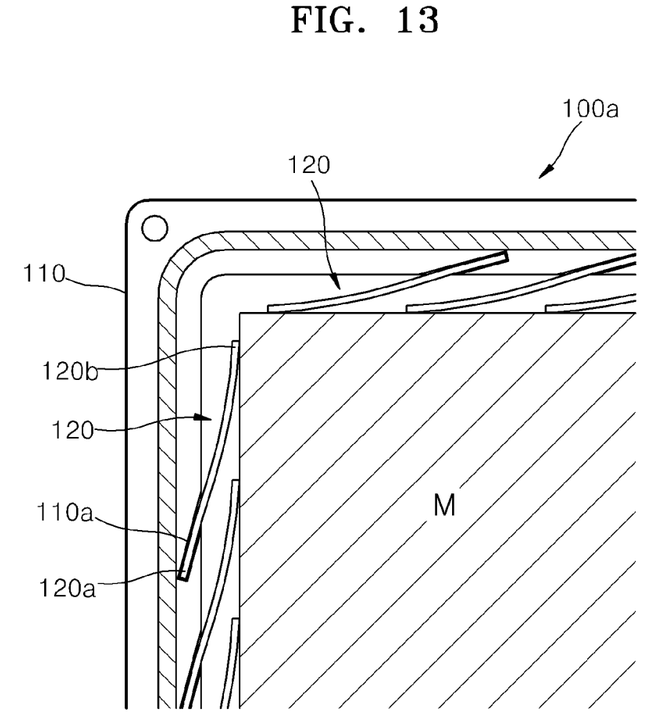
FIG. 13 illustrates a piezoelectric energy harvester according to another exemplary embodiment.

As described later, when no external mechanical energy is applied to the piezoelectric energy harvester 100, the piezoelectric transducers 120 may be provided with their other ends in contact with the mass M without being deformed or slightly separated from the mass M, as shown in FIG. 2A. Alternatively, as illustrated in FIG. 13, the piezoelectric transducers 120 may be provided with their other ends in contact with the mass M such that the piezoelectric transducers 120 are deformed in a forward direction. When external mechanical energy is applied to the piezoelectric energy harvester 100, relative movements are generated between the cover frame 110 and the mass M and thus the interval between the inner wall of the cover frame 110 and the mass M changes. Accordingly, the piezoelectric transducers 120 are deformed so that electrical energy may be generated. FIGS. 3 and 4 illustrate an exemplary embodiment in which three piezoelectric transducers 120 are arranged on each of the inner walls of the cover frame 110 in parallel with one another and angled in one direction. However, exemplary embodiments are not limited thereto and the number and arrangement of the piezoelectric transducers 120 may vary in a variety of ways. Alternatively, only one piezoelectric transducer 120 may be provided between the inner wall of the cover frame 110 and the mass M.

Figure 5:
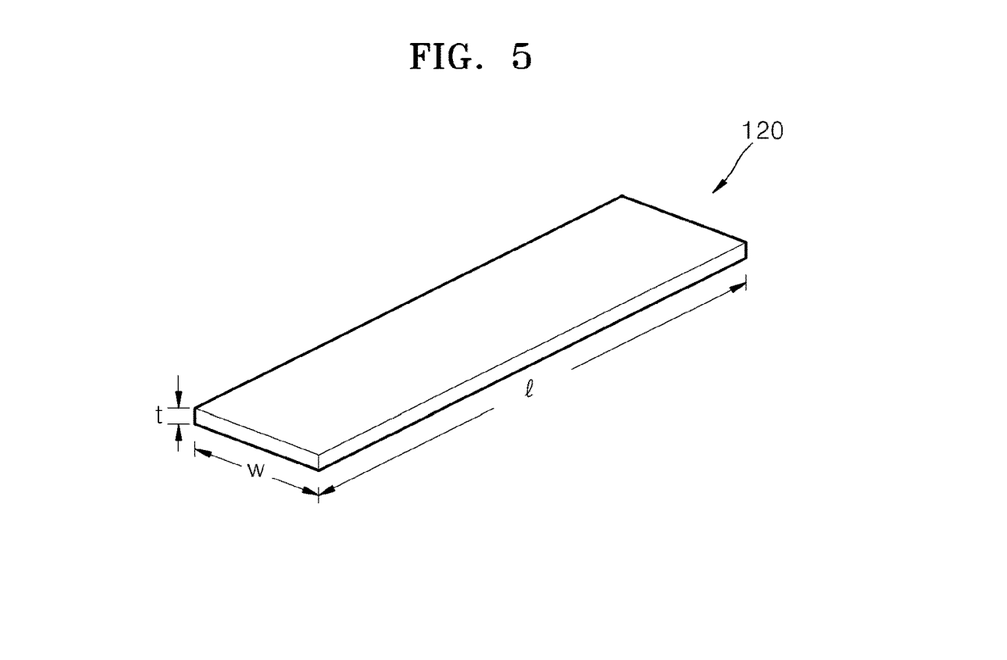
FIG. 5 is a perspective view of a piezoelectric transducer of FIG. 1.

FIG. 5 is a perspective view of one of the piezoelectric transducers 120 of FIG. 3. Referring to FIG. 5, the piezoelectric transducer 120 has a beam shape. In the beam type piezoelectric transducer 120, the amount of electric energy generated by the piezoelectric transducer 120 may be controlled according to the width "w", length "l", and thickness "t" of the piezoelectric transducer 120. The piezoelectric transducer 120 may have a thickness of, for example, about 100 μm-about 800 μm, and preferably about 300 μm, but the exemplary embodiments are not limited thereto.

Figure 6:
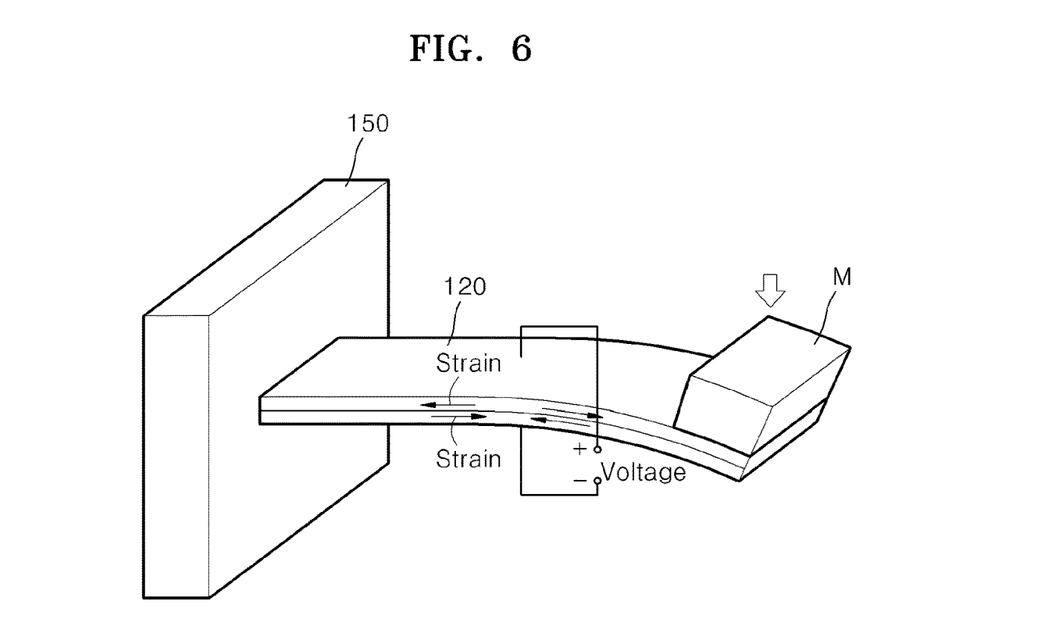
FIG. 6 illustrates an exemplary embodiment of a general cantilever type piezoelectric energy harvester.

FIG. 6 illustrates an example of a general cantilever type piezoelectric energy harvester, according to an exemplary embodiment. Referring to FIG. 6, one end of the piezoelectric transducer 120 illustrated in FIG. 5 is fixed on a support 150 and the piezoelectric transducer 120 is bent by a movement of a mass M, thereby generating electrical energy. In FIG. 6, since the one end of the piezoelectric transducer 120 is fixed to the support 150 and the other end of the piezoelectric transducer 120 is not fixed, the piezoelectric transducer 120 may move up and down. The mass M may be provided at the other end of the piezoelectric transducer 120. In the cantilever type piezoelectric energy harvester 100 according to an exemplary embodiment, when the mass M moves in a predetermined direction, for example, downwardly, the beam type piezoelectric transducer 120 is bent. In doing so, an upper surface of the piezoelectric transducer 120 is strained to have a tensile deformation and a lower surface of the piezoelectric transducer 120 is strained to have a compression deformation so that a voltage may be induced between the upper and lower surfaces of the piezoelectric transducer 120. In the piezoelectric energy harvester 100 according to the present exemplary embodiment, the cover frame 110 is used as the support 150 of FIG. 6 and the mass M movably provided in the cover frame 110 is used as the mass M of FIG. 6.

Figure 7:
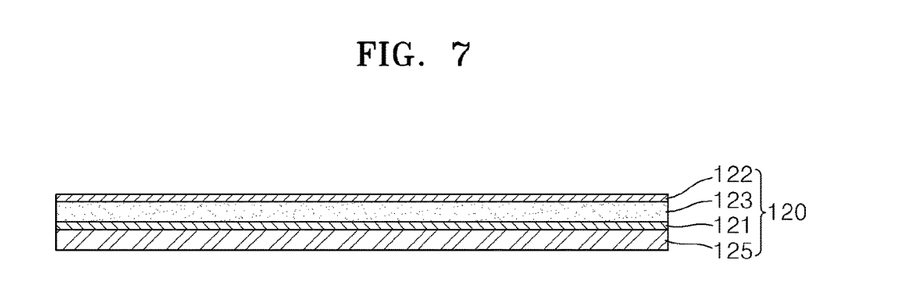
FIG. 7 is a cross-sectional view of the piezoelectric transducer of FIG. 5.

FIG. 7 is a cross-sectional view of the piezoelectric transducer 120 of FIG. 5. Referring to FIG. 7, the piezoelectric transducer 120 has a unimorph structure. In detail, the piezoelectric transducer 120 includes a substrate 125 and an array having a first electrode 121, a piezoelectric layer 123, and a second electrode 122 which are sequentially stacked on the substrate 125. The substrate 125 may include an elastic material. For example, the substrate 125 may include at least one metal selected from a group consisting of SUS, Cu, FR4, Brass, Fe, and W. However, this is just one exemplary embodiment and the substrate 125 may include various materials. As such, when the substrate 125 includes an elastic material, the piezoelectric transducer 120 may exhibit elasticity. The first and second electrodes 121 and 122 may include a conductive material. For example, the first and second electrodes 121 and 122 may include metal such as Ag, Al, Cu, Au, Pd, or Pt. Also, the first and second electrodes 121 and 122 may include graphene, carbon nanotube (CNT), indium tin oxide (ITO), conductive polymer, or other various conductive materials.

The piezoelectric layer 123 generating electrical energy by deformation is provided between the first and second electrodes 121 and 122. The piezoelectric layer 123 may include an inorganic or an organic substance. The inorganic substance may include monolayer ceramic or multilayer ceramic. For example, the piezoelectric layer 123 may include PZT, ZnO, SnO, PVDF, P(VDF-FrFE), or other various materials. In such a structure, when deformation is generated and the piezoelectric layer 123 is bent by an external force, a voltage is induced between the first and second electrodes 121 and 122 so that electrical energy may be generated. Also, when an external shock is applied to the piezoelectric transducer 120, the piezoelectric transducer 120 vibrates at its natural frequency so that a duration time during which electrical energy is generated may be extended.

Figure 8:
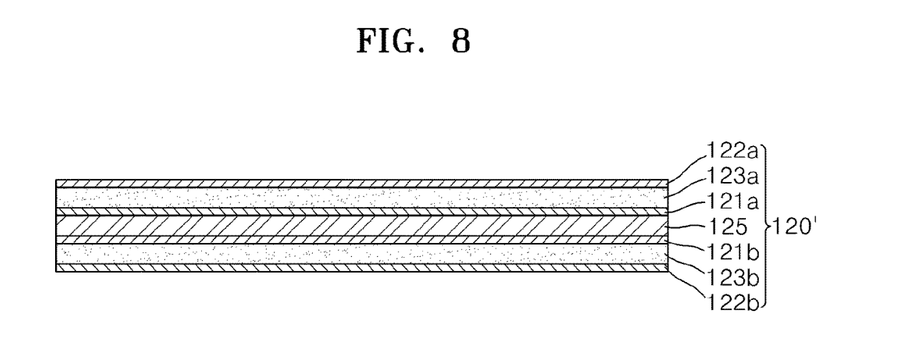
FIG. 8 is a cross-sectional view of an exemplary embodiment of the piezoelectric transducer of FIG. 5.

FIG. 8 is a cross-sectional view of a piezoelectric transducer 120' according to another exemplary embodiment. Referring to FIG. 8, the piezoelectric transducer 120' has a bimorph structure. In detail, the piezoelectric transducer 120' includes the substrate 125, an array having a first electrode 121a, a first piezoelectric layer 123a, and a second electrode 122a which are stacked on a first surface of the substrate 125, and an array having a third electrode 121b, a second piezoelectric layer 123b, and a fourth electrode 122b which are stacked on a second surface of the substrate 125. The substrate 125 may include an elastic material as described above and the piezoelectric transducer 120' may exhibit elasticity. The first, second, third, and fourth electrodes 121a, 122a, 121b, and 122b, respectively, may include a conductive material. The first and second piezoelectric layers 123a and 123b may include inorganic or organic substance. In the bimorph type piezoelectric transducer 120' configured as above, the first, second, third, and fourth electrodes 121a, 122a, 121b, and 122b, respectively, may be connected to one another in series or in parallel.

According to an exemplary embodiment, when the first and second piezoelectric layers 123a and 123b are bent and deformed by an external force, a voltage is induced between the first and second electrodes 121a and 122a and between the third and fourth electrodes 121a and 122b so that electrical energy may be generated. Also, when external shock is applied to the piezoelectric transducer 120', the piezoelectric transducer 120' vibrates at its natural frequency due to its elastic characteristic and thus a duration time during which electrical energy is generated may be extended.

Figure 9:
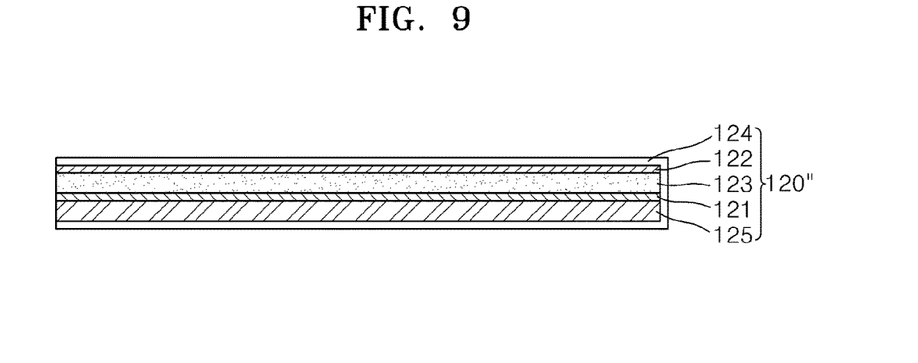
FIG. 9 is a cross-sectional view of another exemplary embodiment of the piezoelectric transducer of FIG. 5.

FIG. 9 is a cross-sectional view of a piezoelectric transducer 120" according to another exemplary embodiment. The piezoelectric transducer 120" of FIG. 9 has a structure in which an insulation layer 124 is formed to cover the piezoelectric transducer 120 having the unimorph structure according to the exemplary embodiment of FIG. 7. The insulation layer 124 may be provided to cover the substrate 125 and the second electrode 122. The insulation layer 124 may protect the piezoelectric transducer 120" or insulate between neighboring piezoelectric transducers 120". Although it is not illustrated, an insulation layer may be formed to cover the piezoelectric transducer 120' having the bimorph structure according to the exemplary embodiment of FIG. 8. According to an exemplary embodiment, the insulation layer may be provided to cover the second and fourth electrodes 122*a* and 122*b*.

As it is illustrated in FIGS. 3 and 4, a circuit 130 may be further provided on the cover frame 110. The circuit 130 may include a rectifier circuit for rectifying the electrical energy generated by the piezoelectric transducers 120 and/or a storage circuit for storing rectified electrical energy. The circuit 130 may be provided along an upper surface of a side wall of the cover frame 110. However, exemplary embodiments are not limited thereto and the circuit 130 may be provided in another portion of the cover frame 110. When the mass M provided in the cover frame 110 is used as an energy storage device, the electric energy generated by the piezoelectric transducers 120 is rectified and then stored in the energy storage device. The electrical energy stored in the energy storage device may be supplied to the mobile device main body 200 provided outside the piezoelectric energy harvester 100, for example, in an upper portion of the piezoelectric energy harvester 100. Also, the electrical energy generated by the piezoelectric transducers 120 may be directly supplied to the mobile device main body 200 via the circuit 130 without being stored.

Figure 10:
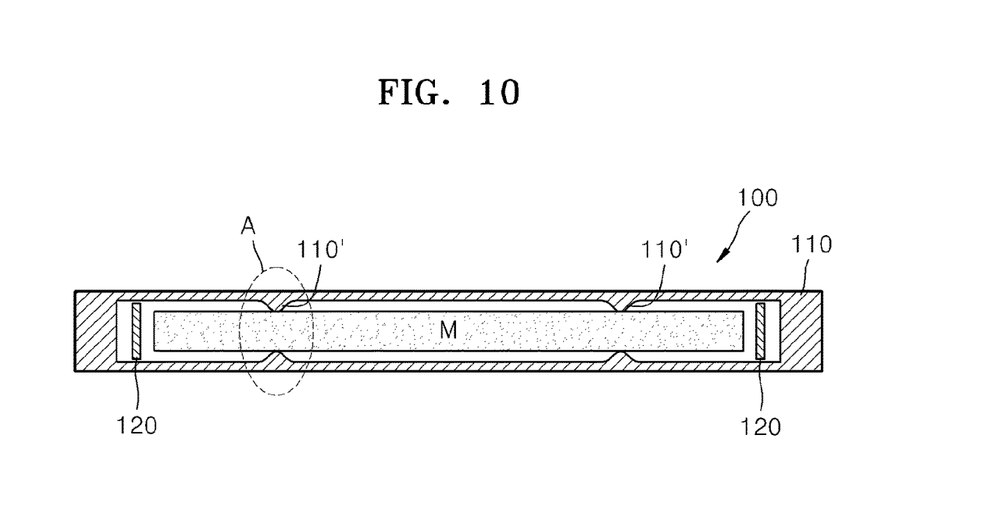
FIG. 10 is a cross-sectional view taken along a line 10-10' of FIG. 2.
Figure 11:
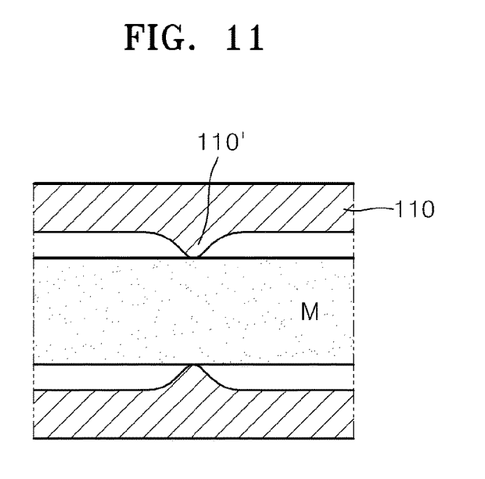
FIG. 11 is a magnified view of a portion A of FIG. 10.

FIG. 10 is a cross-sectional view taken along a line 10-10' of FIG. 2. FIG. 11 is a magnified view of a portion A of FIG. 10. Referring to FIGS. 10 and 11, a plurality of antifriction guides 110' are formed on an upper wall and a lower wall of the cover frame 110. The antifriction guides 110' may protrude from an inner surface of the upper wall and an inner surface of the lower wall of the cover frame 110. The antifriction guides 110' support the mass M in the cover frame 110 to reduce friction between the cover frame 110 and the mass M. In other words, since the antifriction guides 110' protrude from the upper and lower walls of the cover frame 110, only the antifriction guides 110' contact an upper surface and a lower surface of the mass M. Accordingly, friction between the cover frame 110 and the mass M may be reduced and thus a vertical movement of the mass M may be restricted. In such a structure, since most of the mechanical energy, such as external vibration or shock applied to the piezoelectric energy harvester 100, may be converted into electrical energy, electrical energy may be more efficiently generated. Although FIGS. 1 and 2 illustrate that four antifriction guides 110' are provided on each of the upper and lower walls of the cover frame 110, according to an exemplary embodiment, the number of the antifriction guides 110' may vary. Also, the antifriction guides 110' may be provided only on one of the upper and lower walls of the cover frame 110.

Figure 12B:
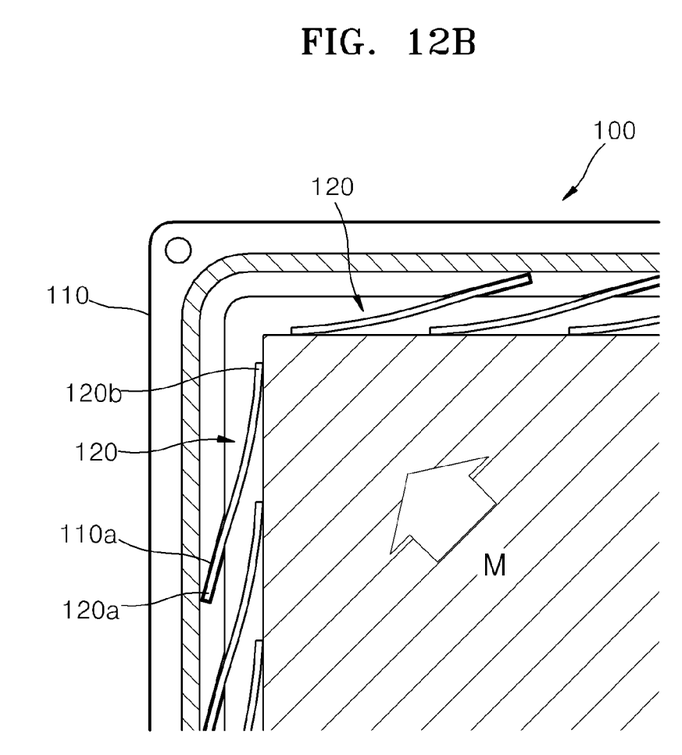

FIGS. 12A and 12B illustrate an operation of the piezoelectric energy harvester 100 of FIGS. 1 to 4, according to an exemplary embodiment. FIG. 12*a* illustrates a case in which no external mechanical energy is applied to the piezoelectric energy harvester 100 and thus no relative movement exists between the cover frame 110 and the mass M. Referring to FIG. 12A, the cover frame 110 and the mass M are separated a certain distance from each other. For example, an interval between the inner wall of the cover frame 110 and the mass M may be about 0.5 mm-about 8 mm, and preferably about 2 mm, but the exemplary embodiments are not limited thereto. In other words, the interval between the inner wall of the cover frame 110 and the mass M may vary in a variety of ways according to the size of the piezoelectric energy harvester 100 or the number and size of the piezoelectric transducers 120.

The piezoelectric transducers 120 are provided between the inner wall of the cover frame 110 and the mass M. First ends 120*a* of the piezoelectric transducers 120 are fixed to the inner wall of the cover frame 110. According to an exemplary embodiment, the insertion holes 110*a* in which the one ends 120*a* of the piezoelectric transducers 120 are fixedly inserted are formed in the inner walls of the cover frame 110. The second ends 120*b* of the piezoelectric transducers 120 are not fixed so that the second ends 120*b* can move freely. As illustrated in FIG. 12A, when no external mechanical energy is applied to the piezoelectric energy harvester 100, the piezoelectric transducers 120 may be maintained without being deformed. The second ends 120*b* of the piezoelectric transducers 120 may be provided in contact with side surfaces of the mass M. Alternatively, the second ends 120*b* of the piezoelectric transducers 120 may be slightly separated from the mass M.

FIG. 12B illustrates that external mechanical energy is applied to the piezoelectric energy harvester 100 and thus relative movements are generated between the cover frame 110 and the mass M. Referring to FIG. 12B, when mechanical energy such as an external vibration or a shock is applied to the piezoelectric energy harvester 100, relative movements are generated between the cover frame 110 and the mass M, and thus the interval between the cover frame 110 and the mass M may be changed. In other words, as the mass M is moved toward the inner wall of the cover frame 110, the interval between the cover frame 110 and the mass M is reduced. Accordingly, the piezoelectric transducers 120 provided between the cover frame 110 and the mass M are deformed so that electrical energy may be generated. In this case, the second ends 120*b* of the piezoelectric transducers 120 that are not fixed may be moved on the side surfaces of the mass M. Alternatively, the piezoelectric transducers 120 may be deformed without the second ends 120*b* of the piezoelectric transducers 120 moving on the side surfaces of the mass M. Also, since the piezoelectric transducers 120 exhibit elasticity, when the external shock is applied to the piezoelectric energy harvester 100, the piezoelectric transducers 120 vibrate at the natural frequency and thus a duration time during which electrical energy is generated may be extended. As such, as the piezoelectric transducers 120 are deformed, electrical energy is generated and the generated electrical energy may be stored in the mass M via the circuit 130 provided on the cover frame 110 or may be supplied to the mobile device main body 200 provided outside the piezoelectric energy harvester 100.

The amount of electrical energy generated as the piezoelectric transducers 120 are deformed may be controlled according to at least one from among the number of the piezoelectric transducers 120, the size and thickness of each of the piezoelectric transducers 120, the interval between the piezoelectric transducers 120, and the interval between the inner wall of the cover frame 110 and the mass M.

In the piezoelectric energy harvester 100 according to the present exemplary embodiment, the piezoelectric transducers 120 are provided between the inner wall of the cover frame 110 and the mass M and electrical energy is generated by the deformation of the piezoelectric transducers 120. Each of the piezoelectric transducers 120 has a cantilever structure in which the first end 120*a* thereof is fixed to the inner wall of the cover frame 110 and the second end 120*b* thereof is not fixed. The piezoelectric transducers 120 may generate electrical energy by being deformed due to relative movements between the cover frame 110 and the mass M. In other words, when mechanical energy such as the external vibration or shock is applied to the piezoelectric energy harvester 100, relative movements are generated between the cover frame 110 and the mass M. Accordingly, as the interval between the cover frame 110 and the mass M is changed, the piezoelectric transducers 120 are deformed, for example, bent, so that electrical energy is generated. Also, since the piezoelectric transducers 120 exhibit elasticity, when the external shock is applied to the piezoelectric energy harvester 100, the piezoelectric transducers 120 vibrate at the natural frequency and thus a duration time during which electrical energy is generated may be extended.

The piezoelectric energy harvester 100 may be applied to most portable electronic devices using a battery and the piezoelectric energy harvester 100 may charge the battery. Since the battery is used as the mass M, the structure of the piezoelectric energy harvester 100 is simple and the piezoelectric energy harvester 100 is easy to carry. Also, the piezoelectric energy harvester 100 may always generate electricity, without any special external input conditions, simply by using vibrations generated when a person carrying the piezoelectric energy harvester 100 walks or moves by a car or a subway train, and may provide an opportunity to charge the battery in an emergency situation when the battery is out.

FIG. 13 illustrates a piezoelectric energy harvester 100a according to another exemplary embodiment. FIG. 13 illustrates a case in which no external mechanical energy is applied to the piezoelectric energy harvester 100a and thus no relative movement exists between the cover frame 110 and the mass M. Referring to FIG. 13, the inner wall of the cover frame 110 and the mass M are separated a certain distance from each other and the piezoelectric transducers 120 are provided between the inner wall of the cover frame 110 and the mass M. As described above, the first ends 120a of the piezoelectric transducers 120 are fixed to the inner walls of the cover frame 110. The insertion holes 110a in which the first ends 120a of the piezoelectric transducers 120 are fixedly inserted are formed in the inner walls of the cover frame 110. The second ends 120b of the piezoelectric transducers 120 are not fixed the second ends 120 can move freely. According to an exemplary embodiment, the piezoelectric transducers 120 may be maintained in a previously deformed state when no external mechanical energy is applied to the piezoelectric energy harvester 100a. The second ends 120b of the piezoelectric transducers 120 are provided in a deformed state in contact with the mass M.

When mechanical energy such as the external vibration or shock is applied to the piezoelectric energy harvester 100a of FIG. 13, relative movements are generated between the cover frame 110 and the mass M and thus the interval between the cover frame 110 and the mass M may be changed. Accordingly, the piezoelectric transducers 120 provided between the cover frame 110 and the mass M in the deformed state are deformed more or less, thereby generating electrical energy. When the piezoelectric transducers 120 are provided between the inner wall of the cover frame 110 and the mass M in the previously deformed state according to an exemplary embodiment, the piezoelectric transducers 120 may more efficiently react to the external vibration so that the amount of electrical energy generated may be increased. Also, since the interval between the inner wall of the cover frame 110 and the mass M may be decreased, the piezoelectric energy harvester 100a may be compact.

Figure 14:
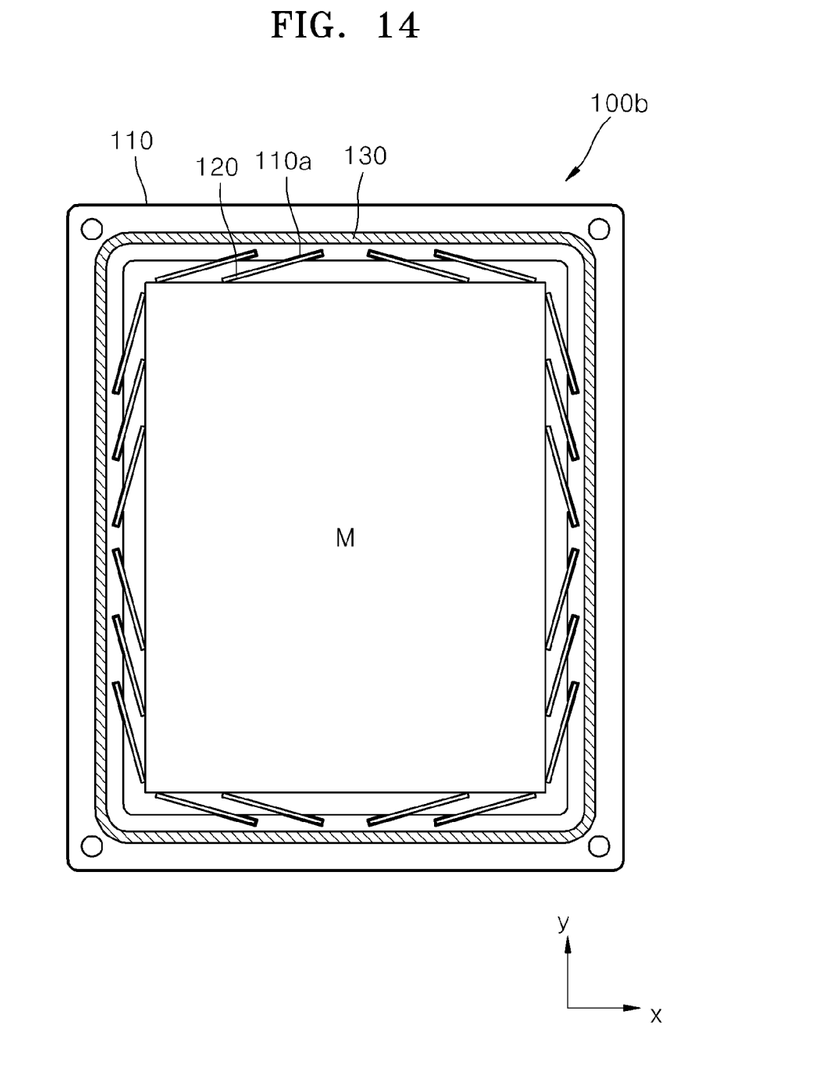
FIG. 14 is a plan view illustrating an interior of a piezoelectric energy harvester according to another exemplary embodiment.

FIG. 14 is a plan view illustrating an interior of a piezoelectric energy harvester 100b according to another exemplary embodiment. The piezoelectric energy harvester 100b of FIG. 14 is substantially the same as the piezoelectric energy harvester 100 of FIG. 3, except for the arrangement of the piezoelectric transducers 120. In the piezoelectric energy harvester 100 of FIG. 3, the piezoelectric transducers 120 are arranged on each of the inner walls of the cover frame 110 in parallel with one another and angled in one direction. However, in the piezoelectric energy harvester 100b of FIG. 14, the piezoelectric transducers 120 are arranged symmetrically at an angle on each of the inner walls of the cover frame 110. The number and arrangement of the piezoelectric transducers 120 of FIG. 14 are not limited to the exemplary embodiments, and the number and arrangement of the piezoelectric transducers 120 may vary.

According to an exemplary embodiment, the mass M is described as an energy storage device such as a battery. However, the mass M may be a mobile device. In this case, since the mobile device is the mass M and is provided in the cover frame 110, the electrical energy generated by the piezoelectric transducers 120 may be stored in an energy storage device of the mobile device or may be directly supplied to a main body of the mobile device.

In the piezoelectric energy harvesters according to the exemplary embodiments, the piezoelectric transducers are provided between the inner wall of the cover frame and the mass and, as the piezoelectric transducers are deformed due to the external vibration or shock, electrical energy may be generated. Also, since the piezoelectric transducers exhibit elasticity, when the external shock is applied to the piezoelectric energy harvester, the piezoelectric transducers may vibrate at the natural frequency, and thus a duration time during which electrical energy is generated may be extended. The piezoelectric energy harvester may be applied to most portable electronic devices using a battery and may charge the battery. Since the battery is used as the mass, the structure of the piezoelectric energy harvester is simple and the piezoelectric energy harvester is easy to carry. Also, the piezoelectric energy harvester may always generate electricity, without any special external input conditions, simply by using vibrations generated when a person carrying the piezoelectric energy harvester walks or moves by a car or a subway train, and may provide an opportunity to charge the battery in an emergency situation when the battery is out.

It should be understood that the exemplary embodiments described herein should be considered in a descriptive sense only and not for purposes of limitation. Descriptions of features or aspects within each exemplary embodiment should typically be considered as available for other similar features or aspects in other embodiments.

While one or more exemplary embodiments have been described with reference to the figures, it will be understood by those of ordinary skill in the art that various changes in form and details may be made therein without departing from the spirit and scope of the exemplary embodiments as defined by the following claims.

What is claimed is:
1. A piezoelectric energy harvester comprising:
a cover frame;
a mass provided in the cover frame; and
at least one piezoelectric transducer provided between an inner wall of the cover frame and the mass and configured to generate electrical energy by being deformed according to a relative movement between the cover frame and the mass,
wherein the at least one piezoelectric transducer includes a first end fixed on the inner wall of the cover frame and a second end that is not fixed such that the second end is freely movable with respect to the mass.

2. The piezoelectric energy harvester of claim 1, wherein the at least one piezoelectric transducer has a beam shape.

3. The piezoelectric energy harvester of claim 1, wherein, when there is no relative movement between the cover frame and the mass, the second end of the at least one piezoelectric transducer is in contact with the mass or separated from the mass.

4. The piezoelectric energy harvester of claim 3, wherein the second end of the at least one piezoelectric transducer is in a state of not being deformed or in a state of being deformed by contacting the mass.

5. The piezoelectric energy harvester of claim 1, wherein the mass comprises at least one of an energy storage device and a mobile device.

6. The piezoelectric energy harvester of claim 1, wherein a circuit configured to perform at least one from among rectifying and storing the electrical energy generated by the at least one piezoelectric transducer is provided on the cover frame.

7. The piezoelectric energy harvester of claim 1, further comprising at least one antifriction guide that protrudes from at least one of an upper wall and a lower wall of the cover frame and reduces friction between the cover frame and the mass.

8. The piezoelectric energy harvester of claim 1, wherein the at least one piezoelectric transducer comprises a substrate and an array of a first electrode, a piezoelectric layer, and a second electrode which are sequentially stacked on the substrate.

9. The piezoelectric energy harvester of claim 8, wherein the at least one piezoelectric transducer further comprises an insulation layer configured to cover the substrate and the second electrode.

10. The piezoelectric energy harvester of claim 8, wherein the substrate comprises an elastic material.

11. The piezoelectric energy harvester of claim 1, wherein the at least one piezoelectric transducer comprises a substrate, an array of a first electrode, a first piezoelectric layer, and a second electrode which are stacked on a first surface of the substrate, and an array of a third electrode, a second piezoelectric layer, and a fourth electrode which are stacked on a second surface of the substrate.

12. The piezoelectric energy harvester of claim 11, wherein the at least one piezoelectric transducer further comprises an insulation layer configured to cover the second electrode and the fourth electrode.

13. The piezoelectric energy harvester of claim 1, wherein an amount of the electrical energy generated when the at least one piezoelectric transducer is deformed is controlled according to at least one from among a number of the at least one piezoelectric transducer, a size and thickness of each of the at least one piezoelectric transducer, an interval between the at least one piezoelectric transducer, and an interval between the inner wall of the cover frame and the mass.

14. A mobile device comprising:
a cover frame;
a mobile device main body provided outside the cover frame;
a mass provided inside the cover frame; and
at least one piezoelectric transducer provided between an inner wall of the cover frame and the mass and configured to generate electrical energy by being deformed according to a relative movement between the cover frame and the mass,
wherein the at least one piezoelectric transducer includes a first end fixed on the inner wall of the cover frame and a second end that is not fixed such that the second end is freely movable with respect to the mass.

15. The mobile device of claim 14 wherein the mass comprises an energy storage device.

16. The mobile device of claim 14, wherein a circuit configured to perform at least one from among rectifying and storing the electrical energy generated by the at least one piezoelectric transducer is provided on the cover frame.

17. The mobile device of claim 14, further comprising at least one antifriction guide that protrudes from at least one of an upper wall and a lower wall of the cover frame and reduces friction between the cover frame and the mass.

18. The mobile device of claim 14, wherein the at least one piezoelectric transducer has a beam shape.

19. The mobile device of claim 14, wherein, when there is no relative movement between the cover frame and the mass, the second end of the at least one piezoelectric transducer is in contact with the mass or separated from the mass.

* * * * *